US009595960B2

(12) United States Patent
Wilford

(10) Patent No.: US 9,595,960 B2
(45) Date of Patent: Mar. 14, 2017

(54) DEAD-FRONT USER INTERFACE

(75) Inventor: Gregory Howard Wilford, Stevensville, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 1100 days.

(21) Appl. No.: 12/773,054

(22) Filed: May 4, 2010

(65) Prior Publication Data

US 2011/0273375 A1  Nov. 10, 2011

(51) Int. Cl.
*G06F 3/041* (2006.01)
*H03K 17/96* (2006.01)

(52) U.S. Cl.
CPC ............ *H03K 17/962* (2013.01); *H03K 2217/960755* (2013.01); *H03K 2217/960785* (2013.01)

(58) Field of Classification Search
CPC ....... G06F 3/044; G06F 1/1626; G09G 5/003; G09G 3/20
USPC .......................... 345/158, 169, 173; 715/701
See application file for complete search history.

(56) References Cited

U.S. PATENT DOCUMENTS

| 4,855,550 | A | | 8/1989 | Schultz, Jr. | |
|---|---|---|---|---|---|
| 4,894,493 | A | | 1/1990 | Smith et al. | |
| 5,153,590 | A | | 10/1992 | Charlier | |
| 5,239,152 | A | * | 8/1993 | Caldwell et al. | ............ 200/600 |
| 5,907,375 | A | | 5/1999 | Nishikawa et al. | |
| 6,168,283 | B1 | | 1/2001 | Howell | |
| 6,388,388 | B1 | | 5/2002 | Weindorf et al. | |
| 6,664,489 | B2 | * | 12/2003 | Kleinhans et al. | ........... 200/313 |
| 6,972,753 | B1 | | 12/2005 | Kimura et al. | |
| 7,319,426 | B2 | | 1/2008 | Garfio | |
| 7,361,860 | B2 | | 4/2008 | Caldwell | |
| 7,532,131 | B2 | * | 5/2009 | Schaefer et al. | ................ 341/22 |
| 7,679,212 | B2 | * | 3/2010 | Ando | ........................... 307/10.1 |
| 2003/0048635 | A1 | * | 3/2003 | Knoerzer et al. | ............. 362/156 |
| 2005/0248540 | A1 | | 11/2005 | Newton | |
| 2006/0066537 | A1 | | 3/2006 | Kimura et al. | |
| 2007/0018965 | A1 | | 1/2007 | Paun et al. | |
| 2007/0165004 | A1 | | 7/2007 | Seelhammer et al. | |
| 2007/0218957 | A1 | * | 9/2007 | Nishikawa et al. | .......... 455/566 |
| 2008/0006709 | A1 | | 1/2008 | Ashworth et al. | |
| 2009/0090605 | A1 | | 4/2009 | Arione et al. | |
| 2009/0090611 | A1 | | 4/2009 | Zeijlon et al. | |
| 2009/0091906 | A1 | | 4/2009 | Arione et al. | |
| 2009/0122017 | A1 | | 5/2009 | Emig et al. | |

(Continued)

FOREIGN PATENT DOCUMENTS

EP    2048781 A1    4/2009

OTHER PUBLICATIONS

European Patent Office, Extended European Search Report for EP11164053.8, Mar. 10, 2014, 7 pages.

*Primary Examiner* — Calvin C Ma

(57) ABSTRACT

A capacitive touch switch is disclosed which includes a transparent insulating panel, a filtering layer having an opaque color, a transparent icon being defined in the filtering layer, a transparent substrate including a capacitive electrode, the transparent substrate being tinted to substantially match the opaque color of the filtering layer, and a light source configured to transmit light through the transparent substrate, the transparent icon, and the transparent insulating panel when energized. A user interface and a method of manufacturing a capacitive touch switch are also disclosed.

20 Claims, 2 Drawing Sheets

(56) References Cited

U.S. PATENT DOCUMENTS

2009/0278813 A1* 11/2009 Wijaya et al. ................ 345/173

* cited by examiner

DEAD-FRONT USER INTERFACE

TECHNICAL FIELD

The present disclosure relates generally to capacitive touch switches which may be utilized in the user controls of domestic appliances or any other devices which employ low-profile user controls. More particularly, the present disclosure relates to a capacitive touch switch capable of displaying a dead-front user interface.

BACKGROUND

Capacitive touch switches may be incorporated into the user controls of devices such as domestic appliances (for example, ovens, microwaves, dishwashers, etcetera) to replace traditional buttons and to provide a low-profile user interface. In the present disclosure, the term "capacitive touch switch," or "switch," refers to any type of sensor which detects the proximity or position of a user (typically, a user's finger) via a change in the capacitance of one or more electrodes. Several capacitive touch switches may be arranged along a panel, along with associated control circuitry, to form a user interface. Each switch may be associated with an icon disposed on the panel.

Visual feedback regarding the status or activation of a particular capacitive touch switch may be provided to a user by selectively illuminating the icon associated with the switch. By way of example, an icon may be semi-transparent, and a light source associated with the icon may cause light to shine through portions of the icon. When an icon is not illuminated, it may be desirable for the icon to be invisible or substantially invisible to the user. When some or all of the icons in a user interface disappear from view, a dead-front effect results in which the panel appears to the user as a monochromatic surface.

SUMMARY

According to one aspect, a capacitive touch switch includes a transparent insulating panel, a filtering layer having an opaque color, a transparent icon being defined in the filtering layer, a transparent substrate including a capacitive electrode, the transparent substrate being tinted to substantially match the opaque color of the filtering layer, and a light source configured to transmit light through the transparent substrate, the transparent icon, and the transparent insulating panel when energized.

In some embodiments, the transparent insulating panel may comprise a colorless material. The opaque color of the filtering layer may be a color other than black or white. The filtering layer may be disposed between the transparent insulating panel and the transparent substrate. In some embodiments, the transparent substrate may be a tinted plastic. The capacitive electrode may be disposed on a surface of the tinted plastic substrate. In other embodiments, the capacitive electrode may be disposed within the tinted plastic substrate.

In some embodiments, the capacitive touch switch may further include an opaque printed circuit board positioned adjacent to the transparent substrate and a controller secured to the printed circuit board. The controller may be electrically coupled to the capacitive electrode and to the light source. The capacitive touch switch may further include a light guide positioned to transmit light from the light source to a side of the transparent substrate opposite the filtering layer and the transparent insulating panel. In such embodiments, the capacitive touch switch may further include an opaque cover positioned on a side of the light guide opposite the transparent substrate, the opaque cover colored to substantially match the opaque color of the filtering layer.

According to another aspect, a method of manufacturing a capacitive touch switch includes aligning (i) an insulating panel having a filtering layer disposed thereon, the filtering layer having an opaque color and defining a transparent icon, and (ii) a transparent substrate tinted to substantially match the opaque color of the filtering layer, the transparent substrate including a capacitive electrode. The method further includes securing the transparent substrate adjacent to the filtering layer disposed on the insulating panel.

In some embodiments, aligning the insulating panel and the transparent substrate may include bringing the transparent icon defined by the filtering layer into alignment with the capacitive electrode of the transparent substrate. In other embodiments, securing the transparent substrate adjacent to the filtering layer may include (i) securing the transparent substrate to a printed circuit board and (ii) securing the printed circuit board to the insulating panel.

In some embodiments, the method may further include positioning a light guide adjacent to the transparent substrate and adjacent to a light source secured to the printed circuit board, such that light is transmitted through the transparent substrate and the transparent icon when the light source is energized. In other embodiments, the method may further include securing an opaque cover adjacent to the light guide, the opaque cover colored to substantially match the opaque color of the filtering layer.

According to yet another aspect, a user interface includes a transparent insulating panel, a filtering layer disposed on the transparent insulating panel, the filtering layer having an opaque color and defining a plurality of transparent icons, a printed circuit board secured to the transparent insulating panel, the printed circuit board having a void formed therein, a transparent substrate including a plurality of capacitive electrodes, the transparent substrate aligned with the void of the printed circuit board and tinted to substantially match the opaque color of the filtering layer, and a plurality of light-emitting diodes soldered to the printed circuit board, each of the light-emitting diodes configured to transmit light through a portion of the transparent substrate, one of the plurality of transparent icons, and a portion of the transparent insulating panel when energized.

In some embodiments, the opaque color of the filtering layer may be a color other than black or white. The transparent substrate may be disposed at least partially within the void of the printed circuit board. In other embodiments, the user interface may further include a plurality of light guides positioned to transmit light from the plurality of light-emitting diodes to a side of the transparent substrate opposite the filtering layer and the transparent insulating panel. In such embodiments, the user interface may further include an opaque cover positioned adjacent to the plurality of light guides, the opaque cover colored to substantially match the opaque color of the filtering layer.

BRIEF DESCRIPTION OF THE DRAWINGS

The detailed description particularly refers to the following figures, in which.

DETAILED DESCRIPTION OF THE DRAWINGS

Figure 1:
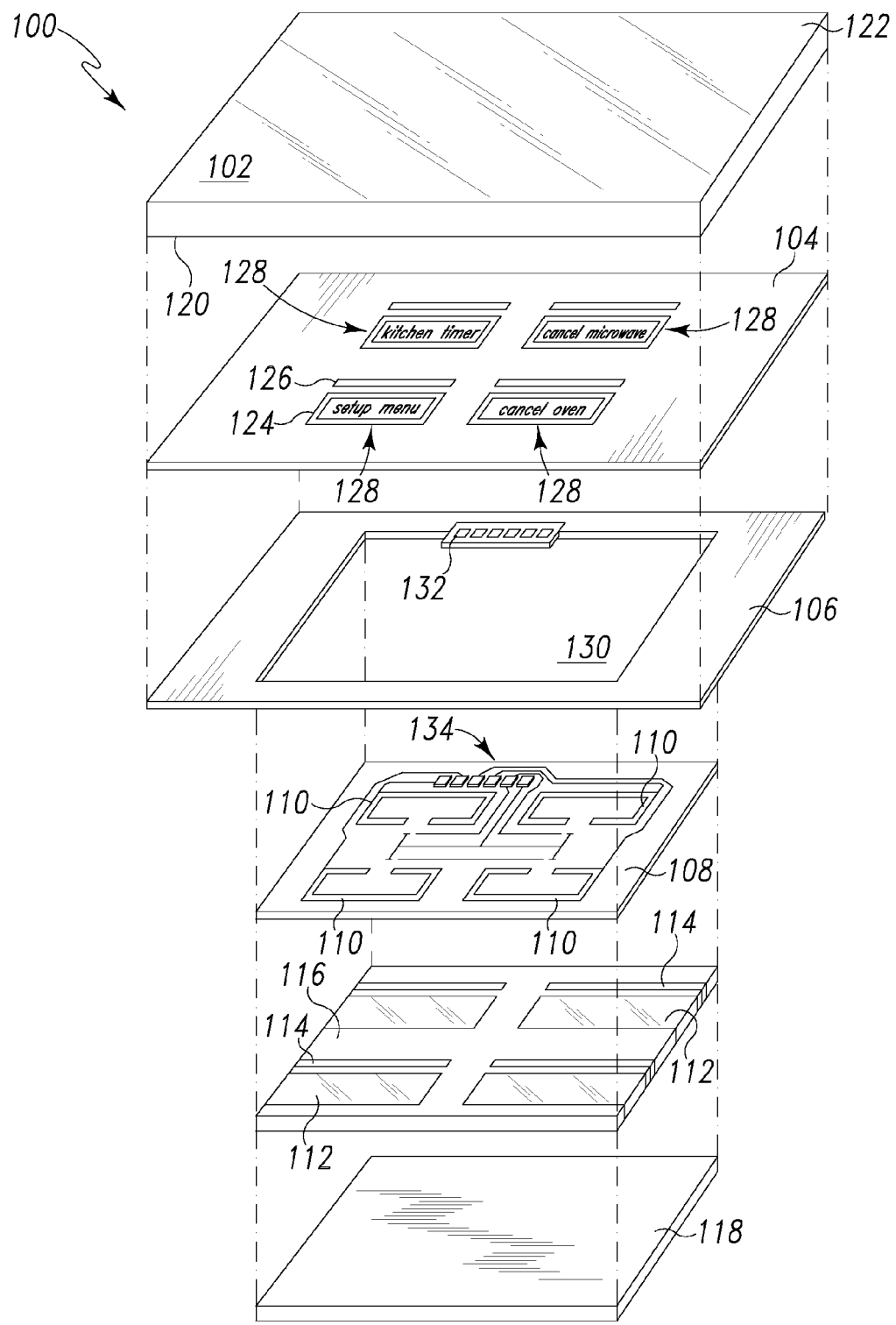
FIG. 1 is an exploded view of one embodiment of a user interface having a dead-front effect.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

Figure 2:
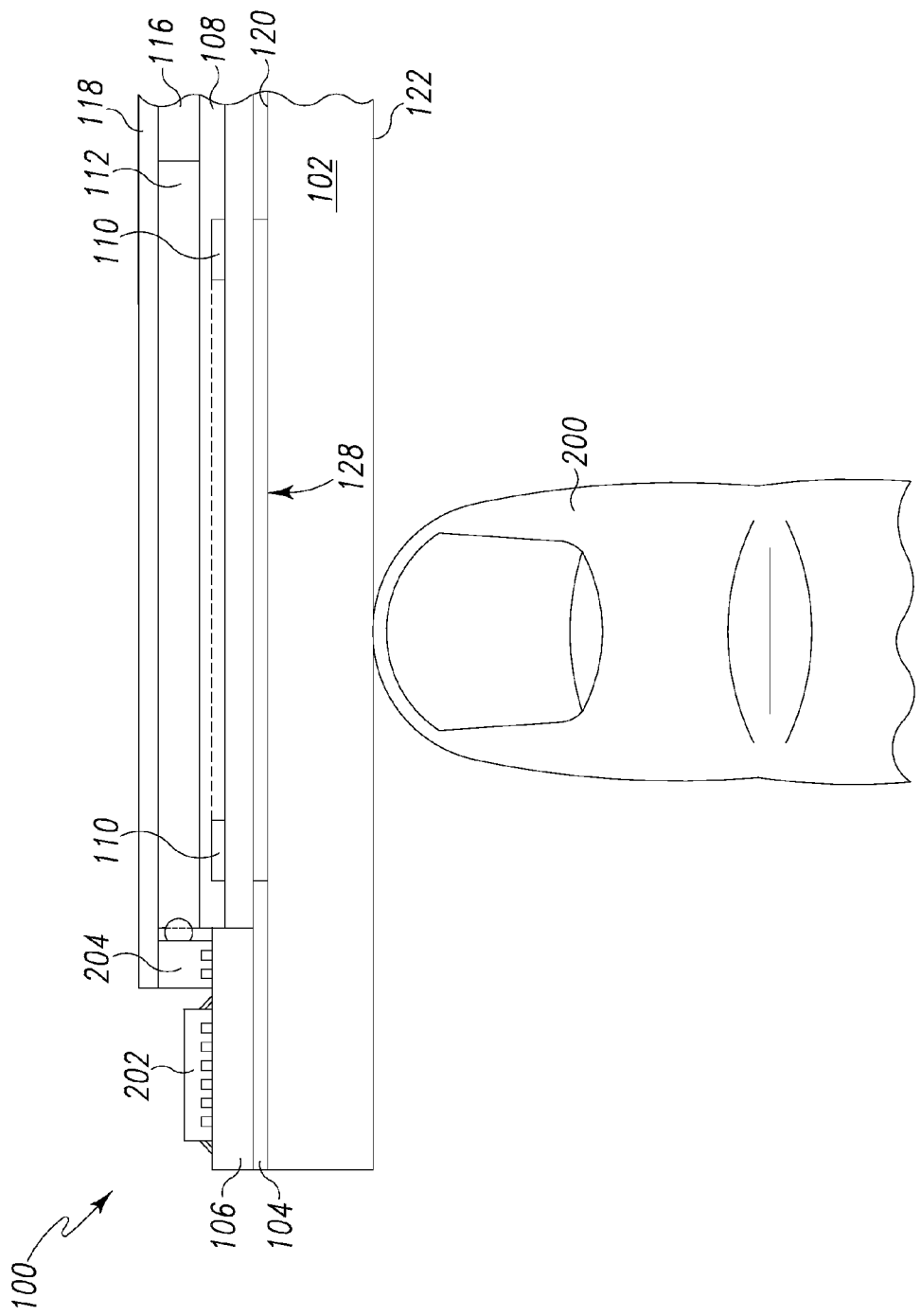
FIG. 2 is a cross-sectional view of an assembled capacitive touch switch of the user interface of FIG. 1.

The present disclosure relates to a user interface including one or more capacitive touch switches capable of displaying a dead-front effect to a user. When an icon associated with one of the capacitive touch switches is not illuminated, the user is presented with a monochromatic surface. The exploded view of FIG. 1 illustrates a pre-assembly view of the components which are combined during manufacture of a user interface 100. The cross-sectional, side view of FIG. 2 illustrates these components in an assembled form. Similar components are labeled using the same reference numerals in both figures.

As shown in FIGS. 1 and 2, an illustrative embodiment of the user interface 100 is constructed from an insulating panel 102, a filtering layer 104, a printed circuit board 106, a transparent substrate 108 including a number of capacitive electrodes 110, a number of light guides 112, 114, a septum 116, and an opaque cover 118, among other components. The user interface 100 is illustratively shown as including four capacitive electrodes 110 and, thus, four capacitive touch switches. It will be appreciated, however, that the user interface 100 may include any number of capacitive touch switches in other embodiments.

The insulating panel 102 creates a smooth front surface for the user interface 100 and serves as a dielectric material between the user 200 and the capacitive electrodes 110. The insulating panel 102 may be formed of any non-conductive material, such as plastic, glass, ceramic, or some combination thereof. The insulating panel 102 is formed of a transparent material, which allows the passage of at least some light. In some embodiments, the insulating panel 102 is formed of a "colorless" material, meaning that the panel 102 is clear and allows substantially all colors of light to pass through it. The insulating panel 102 includes a first face 120 and an opposing, second face 122. In the embodiment shown in FIGS. 1 and 2, the insulating panel 102 is illustratively embodied as an non-tinted, non-frosted glass sheet 102, and the second face 122 is adapted to be touched by the user 200.

A filtering layer 104 may be disposed on or adjacent to the glass sheet 102. The filtering layer 104 generally has an opaque color which allows the passage of little or no light. Select portions 124, 126 of the filtering layer 104, however, are either missing or transparent. These portions 124, 126 are arranged to define a number of appropriately-shaped, transparent icons 128 in the filtering layer 104. Thus, when the filtering layer 104 is backlit, one or more illuminated icons 128 will be displayed to the user 200. The transparent icons 128 may illustratively include multiple regions, such as lower region 124 and upper region 126. Although the user interface 100 may include any number of transparent icons 128, one icon 128 will generally be associated with each capacitive touch switch in the user interface 100.

The filtering layer 104 may be illustratively embodied as a thin film 104 disposed on the first face 120 of the glass sheet 102. Use of the thin film 104 may improve the adaptability of the user interface 100. For example, it is possible to easily customize the user interface for different countries and languages by changing only the thin film 104. Those of ordinary skill will also appreciate that the thin film 104 might be disposed on the second face 122, rather than the first face 120, of the glass sheet 102. Alternatively, the filtering layer 104 may be formed as an icon serigraphy printed directly onto the first face 120 or second face 122 of the glass sheet 102.

The printed circuit board (PCB) 106 carries several electronic components used in the capacitive touch switch 100. The PCB 106 may be formed of an opaque material and may include wiring and electronic components on one or both sides of the board. PCB 106 may be secured to the insulating panel 102 and the filtering layer 104 using any known method, such as adhesives or mechanical connections (e.g., screws), by way of example. As shown in FIG. 1, the PCB 106 may be formed to include a void 130. The void 130 is illustratively rectangular in shape. PCB 106 also includes a number of terminals 132 which partially extend into the void 130. The terminals 132 are configured to electrically couple with corresponding terminals 134 on the transparent substrate 108.

In the illustrative embodiment, a controller 202 and a number of light sources 204 (both shown in FIG. 2) are soldered to the side of PCB 106 opposite the insulating panel 102 and the filtering layer 104. The controller 202 is electrically coupled to the capacitive electrodes 110 (via terminals 132, 134) and the light sources 204. The controller 202 may receive electrical signals from the capacitive electrodes 110 to sense when a user 200 has approached the capacitive touch switch 100 and may provide electrical signals to the light sources 204 to selectively control illumination of the transparent icons 128 of the user interface 100.

The light sources 204 may include any generators of visible light, such as lamps, bulbs, vacuum fluorescents, and light-emitting diodes (LEDs), by way of example. In the presently disclosed embodiments, the light sources 204 are illustratively embodied as a number of low-profile, side-mounted LEDs 204. The LEDs 204 may have several, distinct levels of illumination (e.g., an "off" level, a low level, an intermediate level, a high level, etcetera), which may be used to inform a user 200 when the associated switch 100 is inactive, active, or selected. In the illustrative embodiment, a pair of LEDs 204 are provided to illuminate each icon 128 on the user interface 100.

The user interface 100 also includes a transparent substrate 108 which carries the capacitive electrodes 110. In the illustrative embodiment shown in FIG. 1, the transparent substrate 108 includes four capacitive electrodes 110 with corresponding terminals 134. The capacitive electrodes 110 may be formed of any conductive material, such as a metal or conductive polymer, which will capacitively couple with a user 200 who touches the insulating panel 102. In some embodiments, such as that shown in FIG. 2, the capacitive electrodes 110 may be disposed on a surface of the transparent substrate 108, such as by printing, for example. In other embodiments, the capacitive electrodes 110 may be disposed within the interior of the transparent substrate 108. Illustrative transparent substrates carrying capacitive electrodes are available from IGT Industries Ltd. of Eastleigh, Hampshire, United Kingdom.

The transparent substrate 108 which carries the capacitive electrodes 110 is tinted to substantially match the opaque color of the filtering layer 104. In the illustrative embodiment, the transparent substrate 108 is comprised of a tinted plastic. The transparent nature of the substrate 108 allows light from an energized light source 204 to pass through the transparent substrate 108, the transparent icon 128, and the transparent insulating panel 102 to display an illuminated icon to the user 200. When the light source is de-energized, however, portions of the substrate 108 will be visible to the user 200 through the transparent insulating panel 102 and the transparent icon 128 of filtering layer 104. Tinting of the transparent substrate 108 to substantially match the opaque color of the filtering layer 104 presents the user 200 with the appearance of a monochromatic surface when the icon 128 is not illuminated. This monochromatic surface may be any desired color, and the user interface 100 may achieve an effective dead-front with colors other than black or white.

A number of light guides 112, 114 may be used to transmit light from the LEDs 204 to a side of the transparent substrate 108 opposite the filtering layer 104 and the insulating panel 102. As shown in FIG. 2, an exterior edge of the light guide 112 receives light from a nearby LED 204 and disperses this light across a portion of the transparent substrate 108. In the illustrative embodiment of the user interface 100 shown in FIG. 1, eight light guides 112, 114 are employed (one corresponding to each of the eight LEDs 204 discussed above). The light guides 112, 114 may be divided by an opaque septum 116 to prevent optical interference. Four larger light guides 112 are each used to transmit light from an LED 204 to the lower region 124 of an icon 128. Similarly, four smaller light guides 114 are each used to transmit light from an LED 204 to the upper region 126 of an icon 128. This arrangement allows independent illumination of the various regions 124, 126 of each icon 128, which may be used to distinguish between functions that are available to a user and those that are already selected.

The user interface 100 may also include an opaque cover 118 positioned behind the light guides 112, 114, opposite the transparent substrate 108. The opaque cover 118, like septum 116, further prevents optical interference between the light guides 112, 114. In addition, the opaque cover 118 may be colored to substantially match the opaque color of the filtering layer 104. Such coloring of the opaque cover 118 may further enhance the appearance of a monochromatic surface when a light source 204 is de-energized and the corresponding icon 128 is not illuminated. The opaque cover 118 may be secured to the PCB 106 using any known method, such as adhesives or mechanical connections (e.g., screws), by way of example.

When assembling the user interface 100, a manufacturer may begin with a transparent insulating panel 102. An appropriate filtering layer 104, having a desired color and the desired transparent icons 128, may be disposed on the insulating panel 102. Next, a transparent substrate 108 including a number of capacitive electrodes 110 and having the appropriate tint (which substantially matches the opaque color of the filtering layer 104), is selected by the manufacturer. The insulating panel 102 is then aligned with the transparent substrate 108. In some embodiments, this may include bringing the transparent icon(s) 128 defined by the filtering layer into alignment with the capacitive electrode(s) 110 carried by the transparent substrate 108, as shown in FIG. 1.

After alignment, the manufacturer secures the transparent substrate 108 near, or possibly in contact with, the filtering layer 104 disposed on the insulating panel 102. In some embodiments, this may be accomplished by connecting the transparent substrate 108 to the PCB 106 and, then, securing the PCB 106 to the insulating panel 102, as described above. Once connected, the transparent substrate 108 may reside fully or partially within the void 130 formed in the PCB 106, as shown in FIG. 2. When desirable, the manufacturer may also position light guides 112, 114 near, or possibly in contact with, both the LEDs 204 and transparent substrate 108 and may secure the opaque cover 118 behind the light guides 112, 114. Each of these components may be secured to one another using any known method, such as adhesives or mechanical connections (e.g., screws), by way of example.

As will be appreciated by those of ordinary skill in the art, the user interface 100 illustrated in FIGS. 1 and 2 may include elements other than those shown and described above, such as, by way of example, additional control and display circuitry coupled to the PCB 106. It should also be appreciated that the location of many components may also be altered. While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present invention and fall within the spirit and scope of the present disclosure as defined by the appended claims.

The invention claimed is:

1. A capacitive touch switch comprising:
a transparent insulating panel;
a filtering layer positioned behind the transparent insulating panel, wherein the filtering layer has an opaque color and a transparent icon is defined in the filtering layer;
a transparent substrate positioned behind the filtering layer, wherein the transparent substrate includes a capacitive electrode and is formed of a tinted material that substantially matches the opaque color of the filtering layer; and
a light source configured to transmit light through the transparent substrate, the transparent icon, and the transparent insulating panel when energized.

2. The capacitive touch switch of claim 1, wherein the transparent insulating panel comprises a colorless material.

3. The capacitive touch switch of claim 1, wherein the opaque color of the filtering layer is a color other than black or white.

4. The capacitive touch switch of claim 1, wherein the filtering layer contacts both the transparent insulating panel and the transparent substrate.

5. The capacitive touch switch of claim 1, wherein the tinted material of the transparent substrate is a tinted plastic.

6. The capacitive touch switch of claim 5, wherein the capacitive electrode is disposed on a surface of the tinted plastic material of the transparent substrate.

7. The capacitive touch switch of claim 5, wherein the capacitive electrode is disposed within the tinted plastic material of the transparent substrate.

8. The capacitive touch switch of claim 1, further comprising:
   an opaque printed circuit board positioned adjacent to the transparent substrate; and
   a controller secured to the printed circuit board, the controller electrically coupled to the capacitive electrode and to the light source.

9. The capacitive touch switch of claim 8, further comprising a light guide positioned to transmit light from the light source to a side of the transparent substrate opposite the filtering layer and the transparent insulating panel.

10. The capacitive touch switch of claim 9, further comprising an opaque cover positioned on a side of the light guide opposite the transparent substrate, the opaque cover having a color that substantially matches the opaque color of the filtering layer.

11. The capacitive touch switch of claim 1, wherein the transparent insulating panel comprises a non-tinted, non-frosted glass sheet.

12. A method of manufacturing a capacitive touch switch, the method comprising:
   aligning (i) an insulating panel having a filtering layer disposed thereon, the filtering layer having an opaque color and defining a transparent icon, and (ii) a transparent substrate formed of a tinted material that substantially matches the opaque color of the filtering layer, the transparent substrate including a capacitive electrode; and
   securing the transparent substrate adjacent to the filtering layer disposed on the insulating panel such that the filtering layer is positioned behind the insulating panel and the transparent substrate is positioned behind the filtering layer.

13. The method of claim 12, wherein aligning the insulating panel and the transparent substrate comprises bringing the transparent icon defined by the filtering layer into alignment with the capacitive electrode of the transparent substrate.

14. The method of claim 12, wherein securing the transparent substrate adjacent to the filtering layer comprises (i) securing the transparent substrate to a printed circuit board and (ii) securing the printed circuit board to the insulating panel.

15. The method of claim 14, further comprising positioning a light guide adjacent to the transparent substrate and adjacent to a light source secured to the printed circuit board, such that light is transmitted through the transparent substrate and the transparent icon when the light source is energized.

16. The method of claim 15, further comprising securing an opaque cover adjacent to the light guide, the opaque cover colored to substantially match the opaque color of the filtering layer.

17. A user interface, comprising:
   a transparent insulating panel;
   a filtering layer positioned behind the transparent insulating panel, the filtering layer having an opaque color and defining a plurality of transparent icons;
   a printed circuit board positioned behind the filtering layer, the printed circuit board having a void formed therein;
   a transparent substrate including a plurality of capacitive electrodes, the transparent substrate being disposed at least partially within the void of the printed circuit board and formed of a tinted material that substantially matches the opaque color of the filtering layer; and
   a plurality of light-emitting diodes soldered to the printed circuit board, each of the light-emitting diodes configured to transmit light through a portion of the transparent substrate, one of the plurality of transparent icons, and a portion of the transparent insulating panel when energized.

18. The user interface of claim 17, wherein the opaque color of the filtering layer is a color other than black or white.

19. The user interface of claim 17, further comprising a plurality of light guides positioned to transmit light from the plurality of light-emitting diodes to a side of the transparent substrate opposite the filtering layer and the transparent insulating panel.

20. The user interface of claim 19, further comprising an opaque cover positioned adjacent to the plurality of light guides, the opaque cover having a color that substantially matches the opaque color of the filtering layer.

* * * * *